United States Patent [19]

Maquaire et al.

[11] Patent Number: 5,214,246

[45] Date of Patent: May 25, 1993

[54] GROOVED PACKAGE FOR HYBRID COMPONENTS

[75] Inventors: Jean-Pierre Maquaire, Louveciennes; Jean N. Dody, Rueil Malmaison, both of France

[73] Assignee: Egide S.A., Trappes, France

[21] Appl. No.: 655,005

[22] Filed: Feb. 13, 1991

[51] Int. Cl.$^5$ .................. H01L 23/02; H01L 23/08; H05K 5/00
[52] U.S. Cl. .................. 174/52.4; 174/52.3; 174/52.1; 361/390; 220/4.02
[58] Field of Search .................. 174/52.2, 52.4, 52.1, 174/52.3; 357/74; 361/390, 394, 399, 415; 220/4.02

[56] References Cited

FOREIGN PATENT DOCUMENTS 61-42156  2/1986  Japan .................. 174/52.4

Primary Examiner—Leo P. Picard
Assistant Examiner—B. Lee Ledynh
Attorney, Agent, or Firm—Felfe & Lynch

[57] ABSTRACT

A package for electronic components and especially hybrid components comprises a base, an enclosure formed by lateral walls and a lid having the function of hermetically sealing the package while bearing on a top end of the lateral walls. At least one lateral wall having through-holes for conductors which serve to establish a connection between the interior of the package and the exterior is provided with at least one longitudinal groove in an upper portion located between the through-holes and the top end of the wall.

8 Claims, 2 Drawing Sheets

GROOVED PACKAGE FOR HYBRID COMPONENTS

BACKGROUND OF THE INVENTION

1. Field of the Invention

The present invention relates to a package for electronic components and especially hybrid components. The invention is more particularly applicable to packages which are subjected to airtightness tests after closing of the package by a lid.

2. Description of the Prior Art

In applications such as the aerospace field which require particularly reliable packages from the point of view of airtightness, the packages are tested over a period of two to three months in order to check their stability of airtightness in time.

As a rule, a package is tested at the time of closing by introducing a mixture of nitrogen and a predetermined dose of helium into the package just before fitting the lid and by immediately detecting helium leakages from the package. A test of this type can be performed only instantaneously at the time of closing of the package since, in the event of leakage, the helium disappears almost immediately.

In order to subject a closed package to an airtightness test, it is a customary practice to adopt a method known as "sweating" which consists in putting the package under a pressure of the order of 2 to 4 bar so as to inject helium into the package through any leak locations which may exist. The next step consists in detecting the presence of helium which emerges from the package and thus indicates that leakage is present. In the event that the package is leak-tight, the helium will not have been able to penetrate into the package at the time of injection and no outleakage of helium will consequently be detected.

The problem of testing by the "sweating" method is that pressurization of the package has the effect of forming cracks in the glass beads through which the connecting-leads pass from the interior of the package to the exterior. A cracked package which does not exhibit any leakage at the time of airtightness tests in accordance with the sweating method is not reliable for all that since it is weakened and consequently presents a considerable danger of deficient airtightness in the short term.

Fissures or cracks in the glass beads are due in particular to the bending stress to which lateral walls of the package are subjected by reason of the pressure forces applied on the top face of the lid at the time of putting under pressure. The fact that a soldering process is adopted in order to close the lid on the package and that the soldered joint between the lid and the top face of the walls is concentrated towards the exterior of the package has the effect of increasing the bending phenomenon even further.

It is thus usually observed that the cracked beads located in the central portions of the lateral walls are greater in number than the cracked beads located at the sides close to the point of junction with a lateral wall which extends in another direction. This is explained by the greater rigidity of the lateral walls in proximity to the corners of the package.

A first solution which has already been proposed consists in increasing the rigidity of the lateral walls in the portion located between the glass beads and the lid by widening the walls so as to limit the deformations of the lateral walls when the package is put under pressure.

This solution is practically ineffective since the glass or ceramic beads are too sensitive and the intervals of material which remain in the longitudinal direction between the beads in the lateral walls are usually too small to ensure that the beads are not subjected to any stress.

The aim of the present invention is to remove the disadvantages described in the foregoing by constructing a package for electronic components and especially hybrid components to which airtightness tests can be applied in accordance with the so-called sweating method without any danger of impairment of airtightness of the package as a result of the tests themselves.

SUMMARY OF THE INVENTION

In accordance with its principal feature, the present invention relates to a package for electronic components and especially hybrid components comprising a base, an enclosure formed by lateral walls and a lid having the function of hermetically sealing the package while bearing on a top end of the lateral walls. The package is distinguished by the fact that at least one lateral wall having through-holes for conductors which serve to establish a connection between the interior of the package and the exterior is provided with at least one longitudinal groove in an upper portion located between said through-holes and the top end of the wall.

In contrast to the solutions already proposed which consist in increasing the rigidity of the lateral wall by endeavoring to eliminate the bending effect, the present invention proposes to enhance this bending effect by weakening the lateral walls and by partially reducing their thickness.

It could be supposed that weakening of the lateral walls produces an even greater risk of crack formation at the time of putting the package under pressure. However, the advantage of the solution proposed by the invention is that the location at which deformation of the wall takes place can be precisely determined. The lateral wall is in fact weakened by removal of material and by formation of a longitudinal groove in the upper portion of the wall. The result thereby achieved is that, when the package is put under pressure, only the upper portion of the lateral wall undergoes deformation and no stress is exerted on the glass beads which are inserted in the through-holes for the conductors. The groove thus virtually performs the function of a hinge.

In a first embodiment of the package according to the invention, the groove under consideration is advantageously open towards the interior of the package.

In a second particularly advantageous embodiment of the package according to the invention, the groove is open towards the exterior of the package in order to facilitate machining of the lateral walls. It is in fact easier to form a groove on the external face of the wall than on the internal surface.

In accordance with other advantageous features of the invention:

- Each lateral package wall which has through-holes for connecting-leads is provided with at least one longitudinal groove.
- A longitudinal groove is formed over the entire periphery of the enclosure constituted by the lateral walls.

In accordance with a particularly advantageous feature of the invention, the dimensions of the groove in depth and in height are determined according to the deformations to be absorbed by the upper portion of the lateral walls by reason of the pressures on the package lid.

Thus the size of the groove formed in the lateral walls of the package can be adapted to the size of the package and to the pressure forces to be absorbed by the walls. In fact, as the size of the package is larger, that is to say as the distance between the lateral walls is greater, so the resultant of the pressure forces applied on the lateral walls is larger when the package is put under pressure.

In accordance with further distinctive features of the package contemplated by the invention:

the lateral wall is provided with two parallel longitudinal grooves in the upper portion of the wall;

and in an alternative embodiment, each lateral wall is provided with at least one longitudinal groove on each side of the through-holes.

In fact, since the base of the package is usually brazed to the enclosure whereas the lid is soldered thereon, the upper portions of the lateral walls are more sensitive to deformations. However, particularly in the event that the base is joined to the enclosure by soldering, steps can also be taken to form a longitudinal groove both in the upper portion and in the lower portion of the lateral walls, that is to say on each side of the through-holes.

There has thus been constructed a package for electronic components and especially hybrid components on which airtightness tests may be performed even by the so-called "sweating" method without producing any detrimental effect on the reliability of the package and without thereby impairing the mechanical properties of the package to any appreciable extent.

A more complete understanding of the invention will be gained from the following description in which the essential features and advantages of the invention will become apparent and in which reference will be made to the accompanying drawings.

DESCRIPTION OF THE PREFERRED EMBODIMENTS

Figure 1:
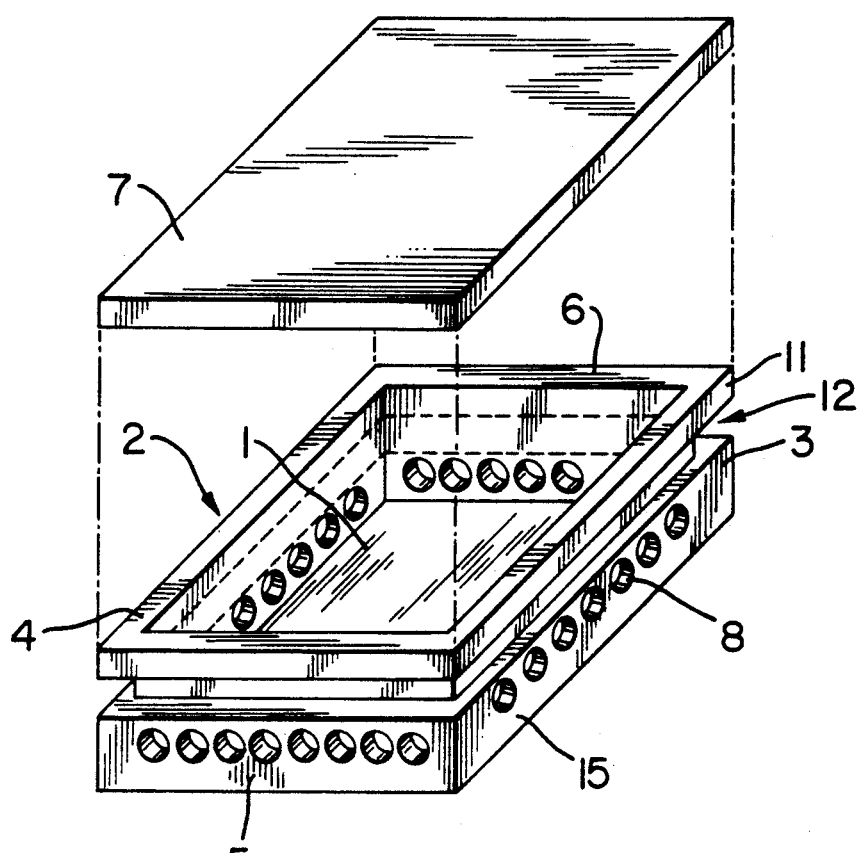
FIG. 1 is a perspective view of a package in accordance with the invention.

The package shown in FIG. 1 has a base 1 and an enclosure 2 formed by lateral walls 3, 4, 5, 6 respectively. A package of this type can be fabricated from an iron/nickel/cobalt alloy designated by the trade name Kovar. The cup formed by the base and lateral walls can be obtained by die-stamping of a metallic sheet of Kovar.

Once the electronic components have been mounted therein, the cup of the package is intended to be closed by a lid 7 which, as a general rule, is also constructed of Kovar (registered trade mark) and which is soldered onto the free end faces of the lateral walls.

It will be readily apparent that the invention applies to packages made of other materials such as for example ceramic, plastic or metal alloy packages.

The lateral walls are usually provided with holes 8 through which connecting-leads can be passed between the interior and the exterior of the package. In each hole is inserted a conductor 9 which is usually of ferronickel and surrounded by a glass or ceramic bead 10 (as shown in FIG. 2).

An upper portion 11 of each lateral wall 3, 4, 5, 6 is provided with a longitudinal groove 12 which has the effect of weakening the walls in this portion. The outline of said groove 12 follows the external periphery of the enclosure 2 in order to ensure uniform distribution of weakening over all the walls.

Figure 2:
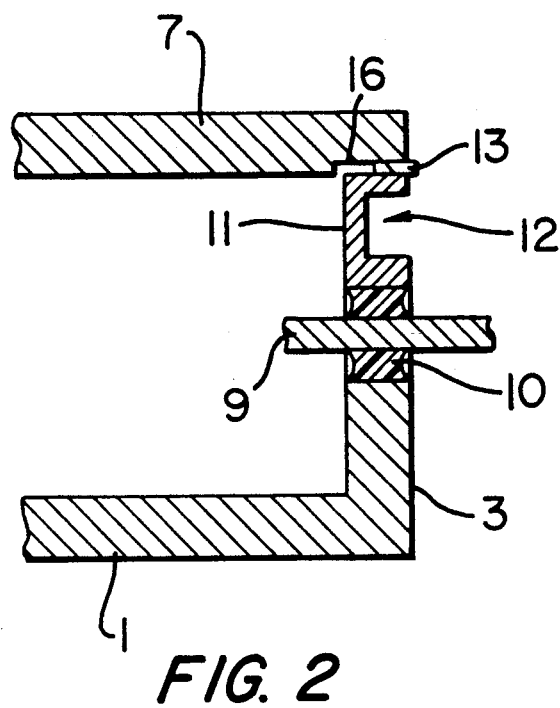
FIG. 2 is a fragmentary sectional view of a package in accordance with the invention.

In FIG. 2, which is a partial sectional view of a package in accordance with the invention, the elements shown are the same as those of FIG. 1 and are designated by the same reference numerals. The package is shown in the closed position. The lid 7 is soldered onto the end face of the lateral walls and the soldered joint is designated in this figure by the reference 13. As a general rule, the lid 7 is shaped so as to have a peripheral stepped recess 16 adapted to cooperate with the top end face of the lateral walls.

Figure 3:
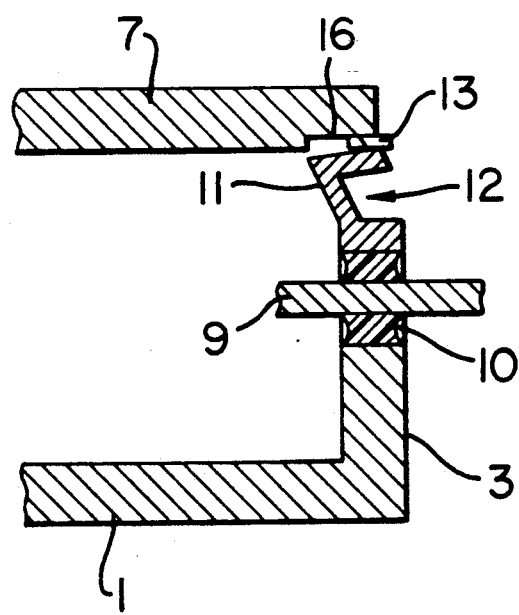
FIG. 3 illustrates schematically the deformation to which the lateral walls are subjected in a package of the type shown in FIG. 2.

FIG. 3 shows schematically and to an exaggerated extent the deformations to which the lateral wall is subjected when the package is put under pressure at the time of airtightness tests by the so-called sweating method. It is observed that the upper portion of the lateral wall 3 undergoes deformation while producing a virtual hinge action, with the result that only this upper portion 11 sustains the pressurization stresses and that the glass beads 10 do not have to withstand any stress and are thus not liable to exhibit any cracks.

Figure 4:
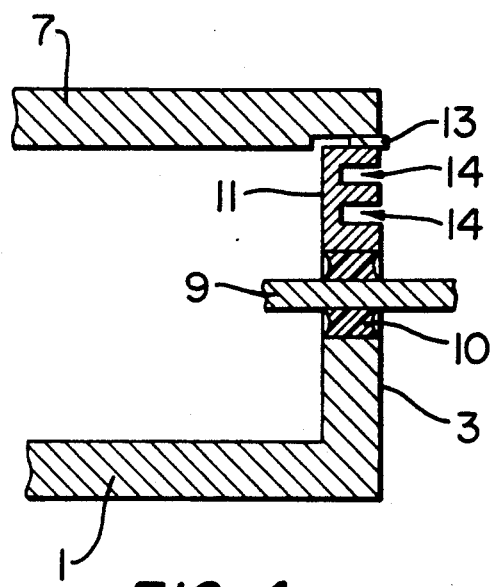
FIG. 4 illustrates an alternative embodiment of the package in accordance with the invention.

FIG. 4 illustrates an alternative embodiment of the package in accordance with the invention, in which the upper portion 11 of the lateral wall 3 has two parallel longitudinal grooves 14 in order to increase the effect of elasticity.

The depth and the height of the groove 12 in the lateral walls can be determined, for example by a calculation of moments of force, by evaluating the stresses to which the lateral walls are liable to be subjected at the time of pressurization of the package under the action of the pressure forces applied on the lid.

In the event that the cup of the package is constructed in two parts or in other words that the base 1 is added to the enclosure 2, provision can be made in the lower portion 15 of the walls 11 for a groove which has the same function as the groove 12 with respect to the elasticity of the upper portions.

As will readily be understood, the invention is not limited in any sense to the particular features which have been specified in the foregoing or to the details of the particular mode of construction chosen for the purpose of illustrating the invention. All kinds of variants may be considered in regard to the particular embodiment which has been described by way of example and its constituent elements without thereby departing from the scope of the invention. Thus the invention includes all means constituting technical equivalents to the means described as well as their combinations.

What is claimed is:

1. A package for electronic components and especially hybrid components comprising a base, an enclosure formed by lateral walls and a lid having the function of hermetically sealing the package while bearing on a top end of the lateral walls, wherein at least one lateral wall having apertures for conductors which serve to establish a connection between the interior of the package and the exterior is provided with at least one longitudinal groove in an upper portion located outside said apertures and between them and the top end of the wall, said groove constituting a longitudinal weakened position in said wall.

2. A package according to claim 1, wherein said groove is open towards the exterior of the package.

3. A package according to claim 1, wherein said groove is open towards the interior of the package.

4. A package according to claim 1, wherein each lateral package wall which has through-holes for connecting-leads is provided with at least one longitudinal groove.

5. A package according to claim 1, wherein the dimensions of said groove in depth and in height are determined according to the deformations to be absorbed by the upper portion of the lateral package walls by reason of the pressures on the lid.

6. A package according to claim 1, wherein the lateral wall has two parallel longitudinal grooves.

7. A package according to claim 1, wherein each lateral wall is provided with at least one longitudinal groove on each side of the through-holes.

8. A package according to claim 1, wherein a longitudinal groove is formed over the entire periphery of the enclosure constituted by the lateral walls.

* * * * *